United States Patent
Jayasena et al.

(10) Patent No.: US 10,522,193 B2
(45) Date of Patent: *Dec. 31, 2019

(54) PROCESSOR WITH HOST AND SLAVE OPERATING MODES STACKED WITH MEMORY

(71) Applicant: ADVANCED MICRO DEVICES, INC., Santa Clara, CA (US)

(72) Inventors: Nuwan S. Jayasena, Sunnyvale, CA (US); Gabriel H. Loh, Bellevue, WA (US); Bradford M. Beckmann, Redmond, WA (US); James M. O'Connor, Austin, TX (US); Lisa R. Hsu, Durham, NC (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/129,252

(22) Filed: Sep. 12, 2018

(65) Prior Publication Data

US 2019/0013051 A1    Jan. 10, 2019

Related U.S. Application Data

(63) Continuation of application No. 13/721,395, filed on Dec. 20, 2012, now Pat. No. 10,079,044.

(51) Int. Cl.
| | | |
|---|---|---|
| *G06F 12/00* | (2006.01) | |
| *G11C 5/06* | (2006.01) | |
| *G06F 12/02* | (2006.01) | |
| *G06F 12/10* | (2016.01) | |
| *G06F 13/16* | (2006.01) | |
| *G11C 7/10* | (2006.01) | |

(52) U.S. Cl.
CPC ............ *G11C 5/06* (2013.01); *G06F 12/02* (2013.01); *G06F 12/10* (2013.01); *G06F 13/1694* (2013.01); *G11C 7/1006* (2013.01)

(58) Field of Classification Search
CPC ....... G06F 12/02; G06F 12/10; G06F 13/1694
See application file for complete search history.

(56) References Cited

U.S. PATENT DOCUMENTS

| | | |
|---|---|---|
| 6,260,082 B1 | 7/2001 | Barry et al. |
| 7,421,693 B1 * | 9/2008 | Joffe ................ G06F 9/383 710/240 |
| 2001/0016789 A1 * | 8/2001 | Staiger ............ B60R 16/0231 701/1 |
| 2003/0097531 A1 | 5/2003 | Arimilli et al. |
| 2003/0200249 A1 | 10/2003 | Gorgone et al. |
| 2004/0243687 A1 | 12/2004 | Sakaguchi |
| 2007/0165457 A1 | 7/2007 | Kim |
| 2008/0040518 A1 | 2/2008 | Yoon |
| 2010/0185808 A1 * | 7/2010 | Yu .................... G06F 13/1684 711/103 |

(Continued)

*Primary Examiner* — Prasith Thammavong
(74) *Attorney, Agent, or Firm* — Volpe and Koenig, P.C.

(57) ABSTRACT

A system, method, and computer program product are provided for a memory device system. One or more memory dies and at least one logic die are disposed in a package and communicatively coupled. The logic die comprises a processing device configurable to manage virtual memory and operate in an operating mode. The operating mode is selected from a set of operating modes comprising a slave operating mode and a host operating mode.

20 Claims, 6 Drawing Sheets

(56) References Cited

U.S. PATENT DOCUMENTS

2010/0213600 A1 8/2010 Lau et al.
2011/0157951 A1 6/2011 Hung et al.
2011/0310030 A1 12/2011 Mundt et al.
2013/0212585 A1 8/2013 Tran

* cited by examiner

PROCESSOR WITH HOST AND SLAVE OPERATING MODES STACKED WITH MEMORY

CROSS REFERENCE TO RELATED APPLICATION

This application is a continuation of U.S. patent application Ser. No. 13/721,395, filed Dec. 20, 2012, issuing as U.S. Pat. No. 10,079,044 on Sep. 18, 2018, the entire contents of which are hereby incorporated by reference as if fully set forth herein

BACKGROUND

1. Field

The embodiments are generally directed to die stacking technology. More particularly, the embodiments are directed to a processor with host and slave operating modes stacked with memory.

2. Background Art

3-D die-stacking technology enables logic dies and memory dies to be stacked in a manner that enables high-bandwidth, low-latency access to the memory from the logic die stacked with it. Such technology presents opportunities for performing computations dose to the memory. However, current mainstream memory designs do not implement any computation capability in memory dies as the memory implementation processes are inefficient tor logic. Current implementations are aimed at either limited logic capability in the memory stack operating under the control of a host processor or processor designs that operate independently out of the stacked memory. Both of these solutions can be improved upon.

BRIEF SUMMARY

Embodiments disclosed provide, by way of non-limiting example, a system, method, and a computer readable medium, including a memory die disposed in a package and a logic die disposed in the package and communicatively coupled to the memory die. The logic die comprises a processing device configurable to manage virtual memory and operate in an operating mode. The operating mode is selected from a set of operating modes comprising a slave operating mode and a host operating mode.

Another non-limiting exemplary embodiment provides a method comprising configuring a logic-memory module to manage virtual memory and operate in an operating mode. The operating mode is selected from a set of operating modes comprising a slave operating mode and a host operating mode. The logic-memory module comprises a package including a logic die stacked with a memory die via through-silicon-vias. Processing operations are distributed between the logic-memory module and an external host processor. The external host processor issues a command to be executed by the logic-memory module and mechanisms are provided to handle address translation for the command.

Further features and advantages of the disclosure, as well as the structure and operation of various embodiments, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form a part of the specification, illustrate embodiments and, together with the description, further serve to explain the principles of the disclosed embodiments and to enable a person skilled in the relevant art to make and use the disclosed embodiments.

Figure 1:
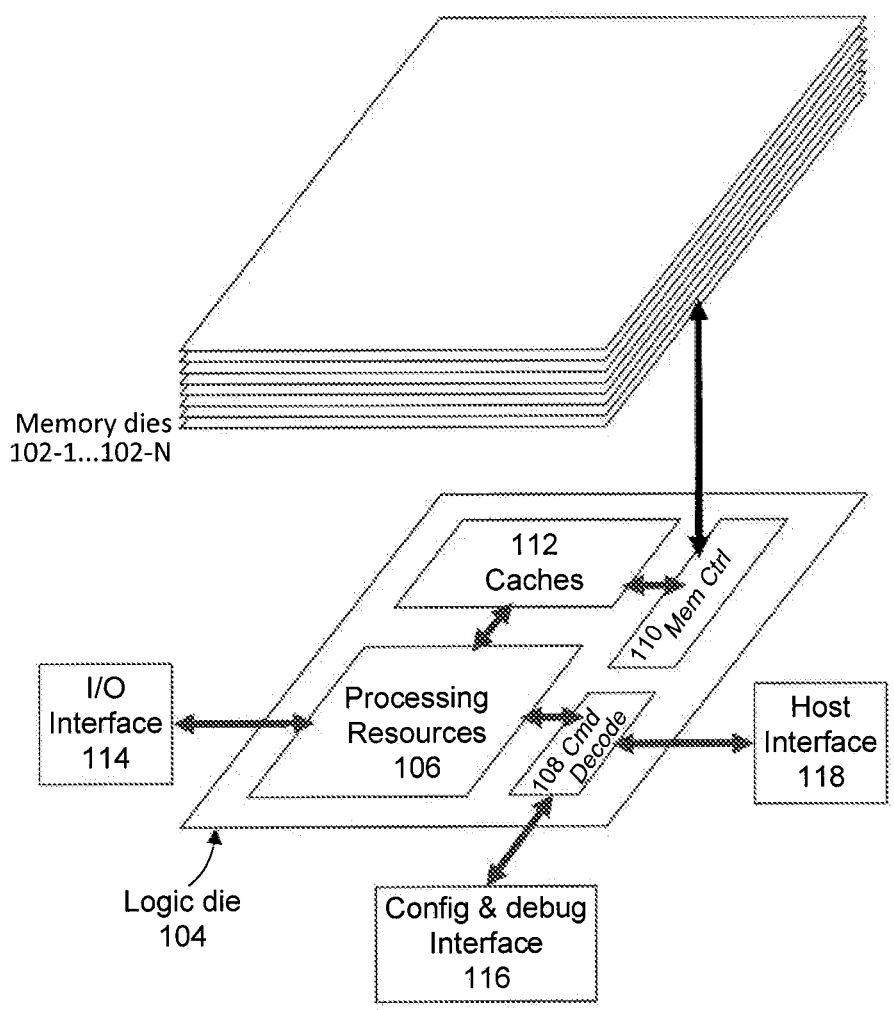
FIG. 1 is an example memory device system, according to embodiments.

The disclosure will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

In the detailed description that follows, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "embodiments" or "embodiments of the invention" do not require that all embodiments include the discussed feature, advantage, or mode of operation. Alternate embodiments may be devised without departing from the scope or spirit of the disclosure, and well-known elements may not be described in detail or may be omitted so as not to obscure the relevant details. In addition, the terminology used herein is for the purpose of describing particular embodiments only and is not intended to be limiting. For example, as used herein, the singular forms "a," "an," and "the" are intended to include the plural forms as well, unless the context clearly indicates otherwise. It will be further understood that the terms "comprises," "comprising," "includes," and/or "including" when used herein, specify the presence of stated features, integers, steps, operations. elements, and/or components, but do not preclude the presence or addition of one or more other features, integers, steps, operations, elements, components, and/or groups thereof.

The following detailed description refers to the accompanying drawings that illustrate exemplary embodiments consistent with this disclosure. Other embodiments are possible, and modifications can be made to the embodiments within the spirit and scope of the disclosure. Therefore, the detailed description is not meant to limit the disclosure. Rather, the scope is defined by the appended claims.

It would be apparent to one of skill in the art that aspects, as described below, can be implemented in many different embodiments of software, hardware, firmware, and/or the entities illustrated in the figures. Any actual software code with the specialized control of hardware is not limiting. Thus, the operational behavior will be described with the understanding that modifications and variations of the embodiments are possible, given the level of detail presented herein.

Additionally, and as will be apparent to one of ordinary skill in the art, the simulation, synthesis and/or manufacture of the various embodiments may be accomplished, in part, through the use of computer readable code (as noted above), including general programming languages (such as C or C++), hardware description languages (HDL) including Verilog HDL, VHDL, Altera HDL (AHDL) and so on, or other available programming and/or schematic capture tools (such as circuit capture tools). This computer readable code can be disposed in any known computer usable medium including semiconductor, magnetic disk, optical disk (such as CD-ROM, DVD-ROM) and as a computer data signal embodied in a computer usable (e.g., readable) transmission medium (such as a carrier wave or any other medium including digital, optical, or analog-based medium). As such, the code can be transmitted over communication networks including the Internet and internets. It is understood that the functions accomplished and/or structure provided by the systems and techniques described above can be represented in a core (such as a graphics processing unit (GPU) core) that is embodied in program code and may be transformed to hardware as part of the production of integrated circuits. As will be appreciated, other types of cores or processing units can provide the functions and/or structure embodying aspects of the contemplated embodiments. These processing units may include, for example, central processing units (CPUs), the aforementioned graphics processing units, digital signal processors, application processors and the like.

Reference to modules in this specification and the claims means any combination of hardware or software components for performing the indicated function. A module need not be a rigidly defined entity, such that several modules may overlap hardware and software components in functionality. For example, a software module may refer to a single line of code within a procedure, the procedure itself being a separate software module. One skilled in the relevant arts will understand that the functionality of modules may be defined in accordance with a number of stylistic or performance-optimizing techniques, for example.

As used herein, the terms "die" and "chip" and the plural form of these terms are used interchangeably throughout this document and are used to denote memory or an integrated circuit on a silicon substrate as is apparent to a person skilled in the relevant art(s).

FIG. 1 is an example memory device system 100, according to embodiments. Memory device system 100 comprises logic and memory resources, forming a logic-memory module. Memory device system 100 is a system that operates as a standalone computing system. In another embodiment, memory device system 100 operates as host-slave system, and operates as a slave to an external host processor. Memory device system 100 creates opportunities to offload memory intensive processing or other "intelligent" memory operations to the logic-memory module. In this way, memory device system 100 enables a single processor/system-on-a-chip (SOC) die to be stacked with memory and used as both a standalone part for high volume markets (e.g., embedded, mobile client device) as well as an "intelligent" memory module for other markets (e.g., HPC, server).

Memory device system 100 includes one or more memory dies 102-1, . . . 102-N, N being a positive integer, stacked on a logic die 104, according to an embodiment. The memory dies 102-1 . . . 102-N and the logic die 104 are small blocks of semiconducting material, on which a given functional circuit is fabricated. 3D die-stacking enables multiple memory dies 102-1 . . . 102 N and logic die 104 to be stacked vertically in a single package on top of each other and connected via through-silicon vias (TSVs). This includes stacking one or more logic dies with one or more memory dies. In such a system, the logic die 104 can be used to implement processors that are coupled to the stacked memory via high-bandwidth and low-latency connections.

In one example, memory device system also includes processing resources 106, command decode module 108, memory controller 110, cache 112, i/o interface 114, config & debug interface 116, and host interface 118.

In an example, memory dies 102-1 . . . 102-N and logic dies 104 can be disposed in a package substrate using for example connector bumps. Connector bumps may be any type of connectors, for example, flip-chip connectors. In an example, the multiple memory dies 102-1 . . . 102-N and the logic die 104 may be stacked together. The terms "stacked," "mounted," and "attached" are used interchangeably throughout and refer to the assembly process where two or more dies may be bonded together. Stacking, for example, a logic die 104 with one or more memory dies 102-1 . . . 102-N, allows for low latency signal exchange between the logic die 104 and the memory dies 102-1 . . . 102-N. In contrast, if a logic die 104 and one or more memory dies 102-1 . . . 102-N are disposed in different packages and mounted on a circuit board, a latency of signal exchange times between the logic die 104 and the one or more memory dies 102-1 . . . 102-N is increased due to the distance between the logic die 104 and the one or more memory dies 102-1 . . . 102-N on the circuit board.

Memory dies 102-1 . . . 102-N can include non-persistent memory such as DRAM. Memory dies 102-1 . . . 102-N can store, e.g., processing logic instructions, constant values, and variable values during execution of portions of applications or other processing logic by processing resources 106 or an external host processor (not illustrated). For example, in one embodiment, parts of control logic to perform one or more operations on processing resources 106 can reside within memory dies 102-1 . . . 102-N during execution of the respective portions of the operation by processing resources 106. During execution, respective applications, operating system functions, processing logic commands, and system software can reside in memory the 102-1 . . . 102-N. Control logic commands fundamental to an operating system run by processing resources 106 will generally reside in memory dies 102-1 . . . 102-N during execution. Other software commands, including, for example, commands from command decode module 108 can also reside in memory dies 102-1 . . . 102-N during execution of memory device system 100. Access to memory dies 102-1 . . . 102-N can be managed by a memory controller 110, which is communicatively coupled to memory dies 102-1 . . . 102-N.

Memory controller 110 is a digital circuit which manages the flow of data going to and from the main memory. It can be a separate chip or integrated into another chip, such as logic die 104. Memory controller 110 includes the logic necessary to read and write to memory dies 102-1 . . . 102-N and to "refresh" the memory dies 102-1 . . . 102-N by sending current through the entire memory device system 100. Refreshing of the memory dies 102-1 . . . 102-N includes reading and re-writing particular rows of the memory dies 102-1 . . . 102-N. Since the charge in a memory cell gradually leaks, before the value leaks to such a level that it can no longer be reliably detected, the system must read and then re-write the cell, which restores the cell's charge to a nominal level that can be reliably read for a while.

IO interface 114 manages external 10 operations. Such IO operations can include support for standard interfaces such as PCIe, USB and display ports as well as debug and other misc. external interfaces in host mode operation. Note that in certain implementations, all or subsets of the host and IO interfaces may be multiplexed onto the same physical connections (e.g., pads).

According to an embodiment, logic die 104 includes processing resources 106. Processing resources 106 can include an accelerated processing unit (APU). Processing resources 106, among other things, executes commands and programs for selected functions, such as graphics operations and other operations that may be for example, particularly suited for parallel processing. In general, processing resources 106 can be frequently used for executing graphics pipeline operations, such as pixel operations, geometric computations, and rendering an image to a display. In various embodiments, processing resources 106 can also execute compute processing operations (e.g., those operations unrelated to graphics such as, for example, video operations, physics simulations, computational fluid dynamics, etc.), based on commands or instructions received from I/O interface 114 or command decode module 108. While embodiments discuss integration of a processing resource such as an APU with memory, other computing devices including but not limited to CPUs, GPUs, FPGAs, DSPs, or other "processor devices" can also be used.

According to an embodiment, processing resources 106 are configurable to manage virtual memory and operate in an operating mode. The operating mode is selected from a set of operating modes comprising a host operating mode and a slave operating mode. Selection of the host operating mode or slave operating mode for processing resources 106 may be achieved in any of several, well-understood configuration mechanisms. In any given embodiment, one or more mode selection mechanisms may be supported, which may include fabrication/packaging time techniques (e.g., fuses), system-design time techniques (e.g., board-level switches that drive configuration inputs), boot-time techniques (e.g., BIOS), or dynamic run-time techniques (e.g., memory-mapped configuration registers written by an external authority. In an embodiment, config & debug interface 116 is configured to manage the configuration, debug, and power management capabilities of the memory device system 100. Configuration via config & debug interface 116 is optional, according to an embodiment. For example, config & debug interface 116 is not necessary when configuration may be achieved by other means such as the use of fuses or memory-mapped configuration registers written by an external entity.

When a host operating mode is selected for processing resources 106, memory dies 102-1 . . . 102-N and logic die 104 can operate autonomously as a standalone computing device, according to embodiment. In such an example, processing resources 106 is configured to run an operating system and use the stacked memory dies 102-1 . . . 102-N as the main memory. According to another embodiment, processing resources 106 is configured to fetch and execute an instruction stream when operated in the host operating mode. Additionally, virtual memory management is handled by the operating system being run by processing resources 106. For example, a memory management unit (MMU) within processing resources 106 in coordination with the operating system can directly handle page faults.

For purposes of illustration, the memory device system 100 outlines embodiments in the context of a single logic die 104 stacked with multiple Dynamic Random Access Memory (DRAM) dies 102-1 . . . 102-N. However, it should be understood that embodiments are applicable to designs based on other memory technologies (including non-volatile memory technologies such as PCM, STT-MRAM, Memristor, etc.) and hybrids of different memory technologies as well as designs with multiple logic dies.

Figure 2:
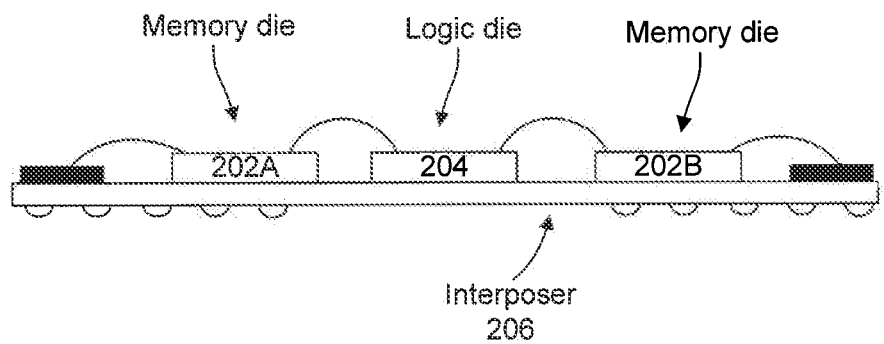
FIG. 2 illustrates a memory device system, in accordance with an embodiment.

Further, the disclosed embodiments are applicable to horizontally-stacked dies where the logic die(s) and the memory die stack are mounted side-by-side on an interposer die and communicate via the interposer. FIG. 2 illustrates such a memory device system. Memory device system 200 includes memory dies 202-A, 202-B and logic die 204 which are horizontally stacked on interposer die 206. Memory dies 202-A, 202-B, and logic die 204 are communicatively coupled via interposer die 206. Interposer die 206 can be made of inorganic materials such as silicon, ceramics and glass. Memory device system 200 can be configured to operate in a similar manner as memory device system 100 discussed above. In addition, in cases where the interposer die 206 includes active devices, the processor and logic described may be implemented in the interposer die 206 instead of a separate logic die.

Returning to FIG. 1, according to an embodiment processing resources 106 is configurable to operate in a slave operating mode, as discussed previously. During a slave operating mode, processing resources 106 is operated under the control of an external host processor (not illustrated). The external host processor communicates with processing resources 106 via host interface 118. Host interface 118 is used by the external host processor to send commands to memory device system 100. Additionally, host interface 118 can be configured to transfer data to/from the memory device system 100 when operated in a slave operating mode.

According to an embodiment, memory device system 100 responds to commands sent from the external host processor. In addition to the discussion herein, embodiments are discussed in further detail below. In an embodiment, the manner in which memory device system 100 handles any received commands depends on a command type of the command. Command decode module 108 is configured to receive all commands received from the external host processor and pass the commands to processing resources 106 when operating in the slave operating mode. Command decode module 108 is further configured to determine the command type of a received command. The command type determines which part of memory device system 100 will handle the command. According to an embodiment, commands can be a processed at different processing destinations of memory device system 100. The processing destination can be either the one or more memory dies 102-1 . . . 102-N or the processing resources 106.

According to an embodiment, when command decode module 108 determines that a received command is of a first command type, command decode module 108 is further configured to bypass processing resources 106 and the commands are processed by the one or more memory dies 102-1 . . . 102-N. For example, fine grain memory access commands such as logical byte, word, or block loads and stores can be identified as a first command type. Such commands will bypass the processor in the memory device system 100 and are handled by the memory stack, possibly under control of the memory controller 110. Such commands are not complex and thus handling of the commands by the memory dies 102-1 . . . 102-N is efficient for memory device system 100.

According to another embodiment, when command decode module 108 determines that a received command is of a second command type, different from the first command type, processing resources 106 is configured to process the commands. Commands of a second command type, for example, can include complex commands that require one or more sequencing operations to be performed, such as a memory access or arithmetic operations. One example of a complex command can include known commands of memory device system 100. Known commands include a known operation identifier that specifies a known software routine and one or more operands. The operands may include pointers to data structures in the memory dies 102-1 . . . 102-N of memory device system 100. In response to receipt of a known command, processing resources 106 executes the corresponding, known software routine. Depending on the nature of the command, the result(s) may be stored in the memory dies 102-1 . . . 102-N or returned to the requesting external host processor. In some embodiments, a subset of the known routines may be fully or partially implemented in hardware (e.g., using specialized accelerators) instead of being implemented in software routines.

Another example of a complex command of a second command type can include user generated commands, according to an embodiment. User-generated commands include a pointer to a user-defined software routine and one or more operands. The operands may include pointers to data structures stored memory dies 102-1, 102-2 . . . 102-N. In response to a user-generated command, processing resources 106 is configured to execute the specified user-defined software routine. Similar to known commands, based on the nature of the user-generated command the result(s) may be stored in memory dies 102-1, 102-2 . . . 102-N or returned to the requesting host processor.

According to an embodiment, the external host processor can be configured to execute an operating system in an asymmetric configuration with processing resources 106 and the processing resources 106 is further configured to execute a spawned process from the external host processor. For example, such a scenario occurs when a complex command such as scheduling command is received by command decode module 108. This creates an Asymmetric Processor where the external host is the primary processor running the operating system, and memory device system 100 is capable of running spawned threads or processes from the external host processor. This sort of asymmetric processing can allow for tight control of data proximity to computation by ensuring the affinity of spawned work to the memory device system where their data mostly resides.

In an embodiment, when operating in a slave operating mode, memory device system 100 is not required to run a mainstream operating system and may instead run a specialized or minimal operating system or no operating system. As a result, translation from virtual to physical address spaces can be managed remotely by the operating system on the external host processor. For illustration, the following two examples are instances where address translation is managed remotely by the operating system on the external host processor. First, in an embodiment, the external host processor can be configured to only issue commands to a memory device system operating in a slave operating mode where all accesses for the command are included within the physical pages (or other contiguous regions of physical memory) for which physical addresses or address translations are provided by the external host processor along with the command. In this case, memory device system 100 does not require any address translation capabilities. Second, in another embodiment, address translation management by the external host processor can be achieved when memory device system 100 has access to an I/O Memory Management Unit (IOMMU) that can walk the page tables of processing resources 106 to locate virtual to physical translations. When the IOMMU encounters a miss within the page table, IOMMU communicates the page fault to the operating system running on the external host processor.

The two examples of address translation management by the external host processor can be combined. For example, one application of memory device system 100 operating in a slave operating mode is for security "sandboxing." Security sandboxing is a mechanism for separating running programs. It is generally used to execute untested code or untrusted programs from unknown or unverified sources. During sandboxing, the external host processor can load data and code into the memory dies 102-1 . . . 102-N and then execute suspect or untrusted code directly in memory device system 100. Memory device system 100 can be configured to disallow access to any memory outside of the system, and therefore any damage, unauthorized access, etc., will be limited to and contained within the memory of memory device system 100. After the execution of the code, the external host processor may analyze the memory contents of memory device system 100 to determine if anything suspicious or malevolent occurred.

According to an embodiment, memory device system 100 is further configurable to operate in a hybrid operating mode. The hybrid operating mode comprises a combination of the slave operating mode and the host operating mode. Memory device system 100 can be configured to run autonomously as a stand-alone computing device and also accept commands from an external host processor. For example processing resources 106 can operate as a standalone computing device as in the Host Mode, capable of initiating its own work, and scheduling its own tasks. In the hybrid operating mode, however, processing resources 106 is also responsive to commands initiated from the external host processor. The memory device system 100 responds to commands from the external host processor and will perform the requested operations. The scheduling of this work can be triggered by a task scheduling software or operating system running on the memory device system 100, or by specialized hardware. This hybrid mode allows processing resources 106 to perform autonomous tasks, outside direct control of the external host processor. These tasks could include, but are not limited to verifying and repairing memory consistency, virus scanning, compression or decompression of memory regions, garbage collection, remapping of data storage locations for wear leveling, remapping of data storage locations for improved performance, etc.

Figure 5:
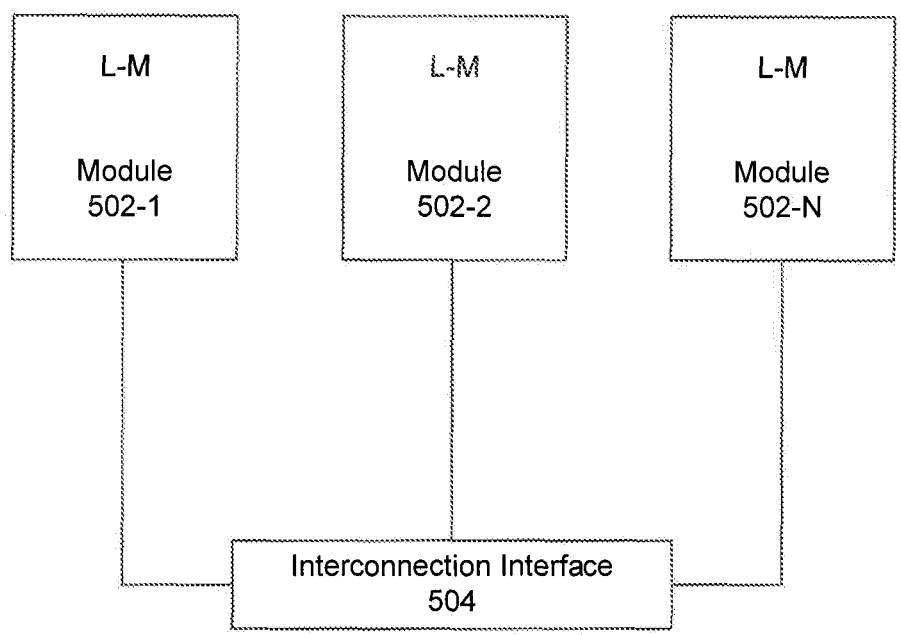
FIG. 5 illustrates a memory device system, in accordance with an embodiment.

Some embodiments may also incorporate a switch and network ports into the memory device system 100, enabling networks of logic-memory modules. According to an embodiment multiple instances of the memory device system 100 can be combined on an interposer or a single motherboard (i.e., one memory device system module per socket) to implement a conventional SMP system. FIG. 5 illustrates such a memory device system 500. Memory device system 500 includes one or more logic-memory (L-M) modules 502-1, 502-2 . . . 502-N and an interconnection interface 504. Each L-M module 502-1, 502-2 . . . 502-N, can be the equivalent of memory device system 100. For example, each L-M module 502-1, 502-2 . . . 502-N can comprise a plurality of additional memory dies disposed in packages and each package can be communicatively coupled to each other via interconnection interface 504. Additionally, a plurality of logic dies can be disposed in each package and can be communicatively coupled to the plurality of additional memory dies. In such a scenario, each L-M module 502-1, 502-2, 502-N in the system is still considered "standalone" as each module is still able to execute a program independently and without requiring assistance from an external host entity. Alternatively, the system can be configured such that at least one of the L-M modules is configured to operate in the host operating mode and another L-M module is configured to operate in the slave operating mode.

This enables a network of L-M modules in slave mode to be controlled by one or more host processors. Alternatively, a network made up entirely of L-M modules may operate under the control of one or more L-M modules in host mode (and all others in slave mode). The processing resource in the L-M module may also support virtualization to provide the illusion to the system that many logical L-M modules exist even though one (or a few) physical modules exist. The L-M module would include additional memory mapping support such that memory accesses from a virtualized L-M module are mapped to the comet physical memory addresses in the physical L-M module, according to an embodiment.

Figure 3:
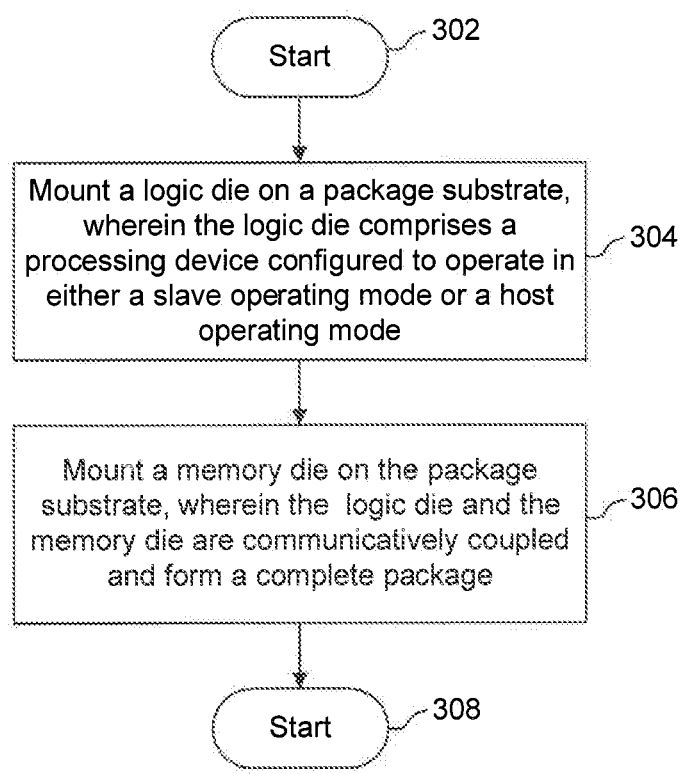
FIG. 3 is a flowchart illustrating operations by which a memory device system is developed, in accordance with an embodiment.

FIG. 3 is a flowchart depicting an exemplary method 300, according to an embodiment. In one example, method 300 can be used to create a memory device system 100.

Method 300 starts at step 302. In step 304, a logic die is mounted on a package substrate. The logic die comprises a processing device configurable to manage virtual memory and operate in an operating mode. The operating mode is selected from a set of operating modes comprising a slave operating mode and a host operating mode. The processing device can include an accelerated processing unit (APU), CPU, GPU, FPGA, DSP, or any other kind of "processor" capable of executing and processing commands and programs for selected functions. Selection of a host operating mode or a slave operating mode for the processing device may be achieved using various techniques. For example, a host operating mode or a slave operating mode may be selected via fabrication/packaging time techniques (e.g., fuses), system-design time techniques (e.g., board-level, switches that drive configuration inputs), boot-time techniques (e.g., BIOS), or dynamic run-time techniques (e.g., memory-mapped configuration registers written by an external authority). During a host operating mode, the processing device can operate as a stand-alone computing device capable of running its own operating system and/or fetching and executing its own instruction stream. During a slave operating mode, the processing device can operate as a slave to an external host processor and the system creates opportunities to offload memory intensive processing operations to the processing device.

In step 306, a memory die is mounted on the package substrate including the logic die. The memory die and logic die are communicatively coupled. The memory die can include non-persistent memory such as DRAM, for example. In an embodiment, the memory die and the logic die including the processing device are stacked. The memory die and the logic die may be stacked using compression heat bonding, for example. As discussed previously, in host operating mode, the processing device runs its own operating system and operates as a standalone processor operating out of the memory die. In slave operating mode, the die-stacked processing device operates under the control of an external host processor and provides "intelligent memory" functionality in the stack. In this way, method 300 enables a single processor/system-on-a-chip (SOC) die to be stacked with memory and used as both a standalone part for high volume markets (e.g., embedded, mobile client device) as well as an "intelligent" memory module for other markets (e.g., HPC, server). Method 300 ends at step 308.

Figure 4:
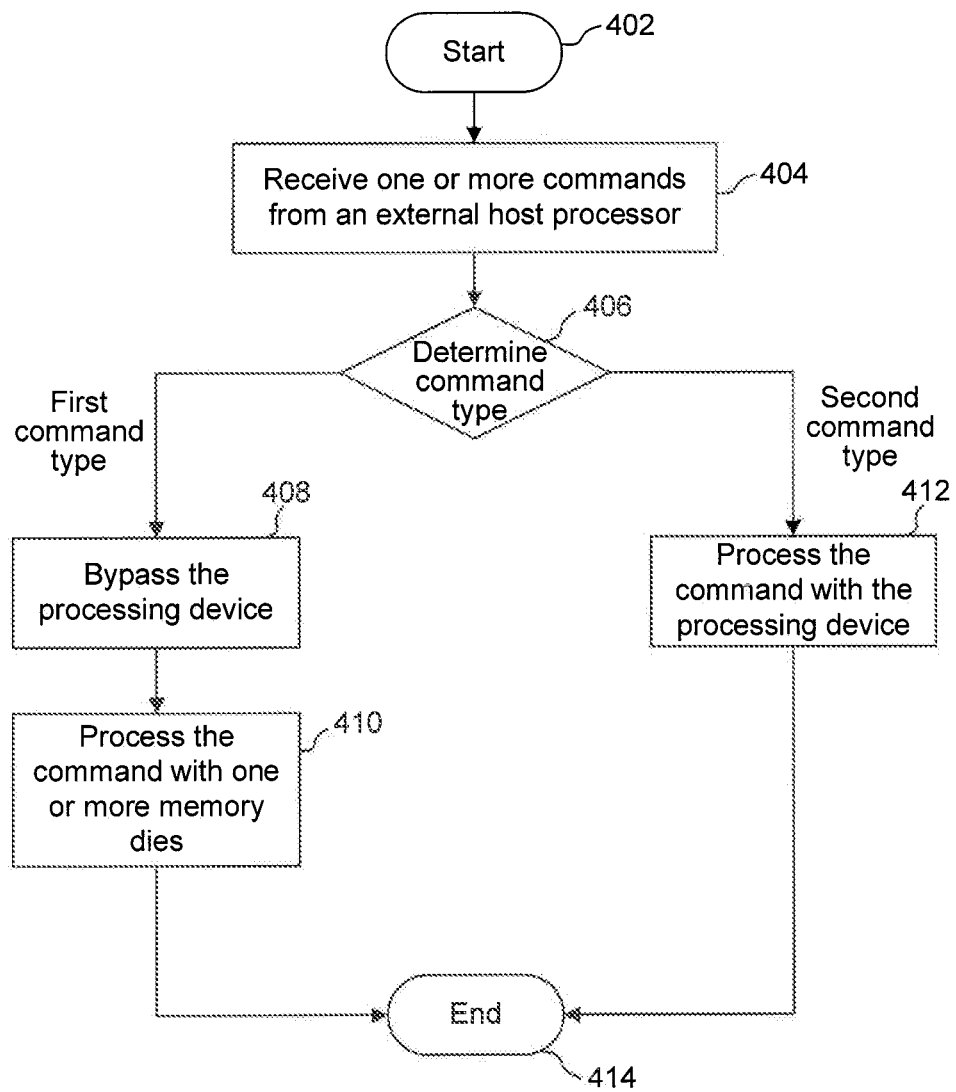
FIG. 4 is a flowchart illustrating operation of memory device system processing in accordance with an embodiment.

FIG. 4 is a flowchart depicting an exemplary method 400, according to an embodiment. For ease of explanation, system 100 in FIG. 1 will be used to describe method 400, but is not intended to be limited thereto. In one example, method 400 can be used to operate a memory device system, according to embodiments. The method 400 may not occur in the order shown, or require all of the steps.

Method 400 starts at step 402. At step 404, one or more commands are received from an external host processor. For example, step 404 may be performed by command decode module 108 of memory device system 100. The one or more commands are received horn an external host processor when memory device system 100 is configured to operate in a slave operating mode. Memory device system 100 is configured to execute commands and programs for selected functions, such as graphics operations, compute processing commands, pixel operations, geometric computations, and rendering an image to a display. For example, commands can be considered a special instruction that is not defined in an instruction set architecture (ISA) and usually accomplished by a set of instructions from a given ISA or a unique piece of hardware.

At step 406, a command type is determined for each of the one or more received command types. For example, step 406 may be performed by command decode module 108 of memory device system 100. A command type could be of at least a first command type or second command type, according to embodiments. Commands of a first command type can include simple low-intensive operations such is loading and storing of data to memory. Commands of a second command type, can include complex commands such as known-commands, user-generated commands, or any commands that require a sequencing of operations.

If a received command is determined to be of a first command type, method 400 proceeds to step 408. At step 408, the processing device is bypassed. For example, step 408 may be performed by command decode module 108 of memory device system 100. Commands of a first command type will bypass the processing device since they are not complex and can be handled more efficiently by other sources, such as the memory stack. Thus, in this way, the processing device is reserved for more complex and processing intensive commands.

At step 410, commands of a first command type are processed by one or more memory dies. For example, step 410 may be performed by memory dies 102-1 . . . 102-N, potentially under the control of the memory controller 110, of memory device system 100. As discussed previously, simple commands of a first command type can be efficiently handled by the memory of the memory device system 100.

Thus, operations such as data loads and stores can be handled efficiently and directly by the memory dies stacked with the processing device, as opposed to the processing device.

If a received command is determined to be of a second command type, method 400 proceeds to step 412. At step 412, the processing device handles the processing of the commands. For example, step 412 may be performed by processing resources 106 of memory device system 100. As discussed previously, commands of a second command type can include complex commands that require one or more sequencing operations to be performed, such as memory access or arithmetic operations. The commands may include pointers to data structures in the memory dies 102-1 . . . 102-N of memory device system 100. In response to receipt of a command of a second command type, processing resources 106 executes the corresponding routine. Depending on the nature of the command, the result(s) may be stored in the memory dies 102-1 . . . 102-N or returned to the requesting external host processor.

Figure 6:
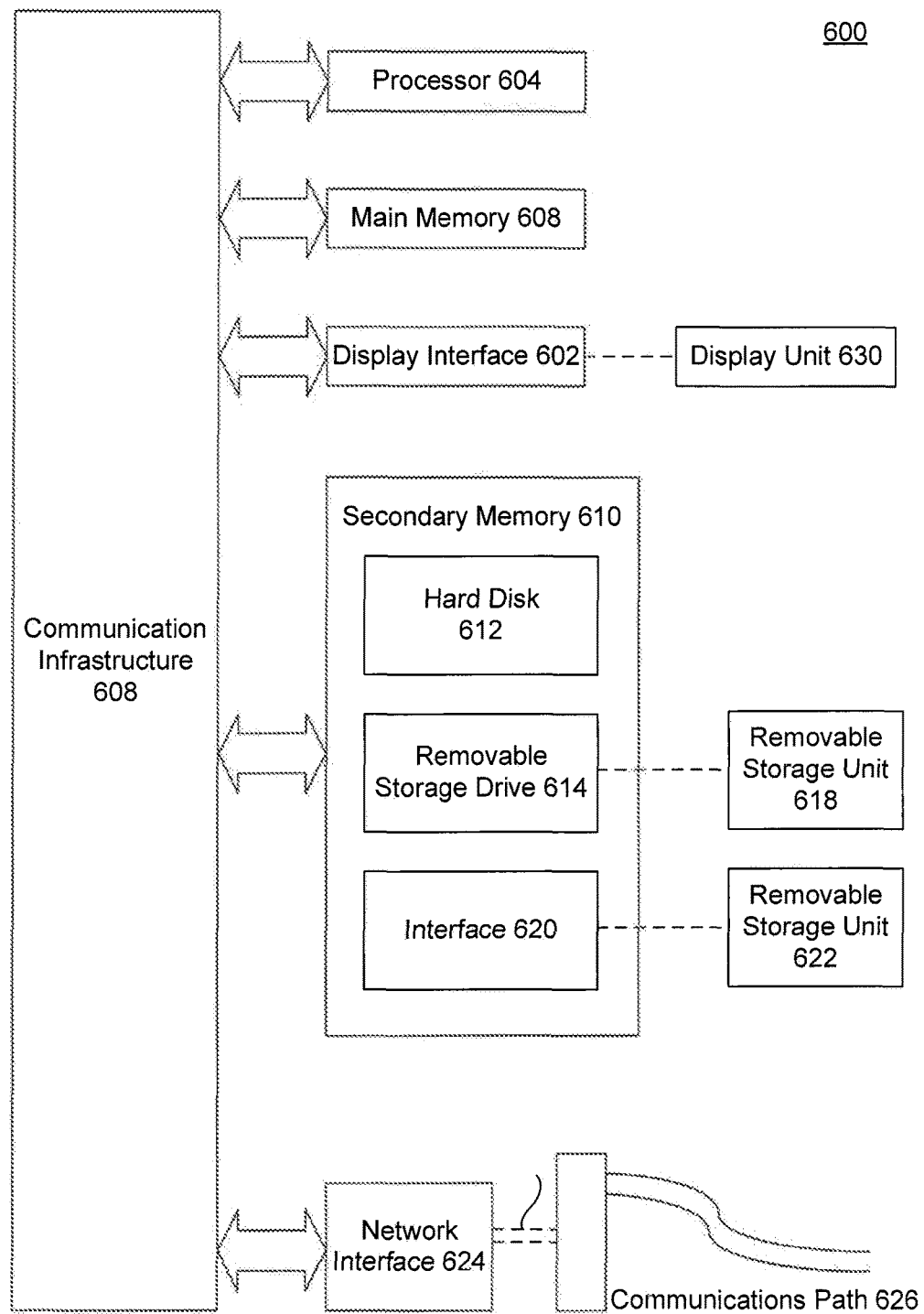
FIG. 6 depicts an example computer system in which embodiments may be implemented.

Various aspects can be implemented by software, firmware, hardware, or a combination thereof. FIG. 6 illustrates an example computer system 600 in which contemplated embodiments, or portions thereof, can be implemented. For example, the methods illustrated by flowcharts 400 of FIG. 4 can be implemented in system 600. Various embodiments are described in terms of this example computer system 600. After reading this description, it will become apparent to a person skilled in the relevant art how to implement the contemplated embodiments using other computer systems and/or computer architectures.

Computer system 600 includes one or more processors, such as processor 604. Processor 604 can be a special purpose or a general purpose processor. Processor 604 is connected to a communication infrastructure 606 (for example, a bus or network).

Computer system 600 also includes a main memory 608, preferably random access memory (RAM), and may also include a secondary memory 610. Secondary memory 610 may include, for example, a hard disk drive 612, a removable storage drive 614, and/or a memory stick. Removable storage drive 614 may comprise a floppy disk drive, a magnetic tape drive, an optical disk drive, a flash memory, or the like. The removable storage drive 614 reads from and/or writes to a removable storage unit 618 in a well-known manner. Removable storage unit 618 may comprise a floppy disk, magnetic tape, optical disk, etc. that is read by and written to by removable storage drive 614. As will be appreciated by persons skilled in the relevant art(s), removable storage unit 618 includes a computer usable storage medium having stored therein computer software and/or data.

In alternative implementations, secondary memory 610 may include other similar means for allowing computer programs or other instructions to be loaded into computer system 600. Such means may include, for example, a removable storage unit 622 and an interface 620. Examples of suds means may include a program cartridge and cartridge interface (such as that found in video game devices), a removable memory chip (such as an EPROM, or PROM) and associated socket, and other removable storage units 622 and interfaces 620 that allow software and data to be transferred from the removable storage unit 622 to computer system 600.

Computer system 600 may also include a communications interface 624. Communications interface 624 allows software and data to be transferred between computer system 600 and external devices. Communications interface 624 may include a modem, a network interface (such as an Ethernet card), a communications port, a PCMCIA slot and card, or the like. Software and data transferred via communications interface 624 are in the form of signals that may be electronic, electromagnetic, optical, or other signals capable of being received by communications interface 624. These signals are provided to communications interface 624 via a communications path 626. Communications path 626 carries signals and may be implemented using wire or cable, fiber optics, a phone line, a cellular phone link, an RF link or other communications channels. As will be appreciated, computer system 600 may be embodied in a number of different form factors or types of computer systems. For example, aspects may be embodied in handheld or other mobile computing systems, set top boxes, conventional computers (e.g., laptops, desktops, servers), tablets, embedded systems, televisions, audio/video equipment, and the like. Computer systems embodying aspects may, in certain scenarios, result in reduced expenses (e.g., reduced or more efficient processing, reduced time to completion, reduced power, and the like).

In this document, the terms "computer program medium" and "computer usable medium" are used to generally refer to media such as removable storage unit 618, removable storage unit 622, and a Lard disk installed in hard disk drive 612. Signals carried over communications path 626 can also embody the logic described herein. Computer program medium and computer usable medium can also refer to memories, such as main memory 608 and secondary memory 610, which can be memory semiconductors (e.g., DRAMs, etc.). These computer program products are means for providing software to computer system 600.

Computer programs (also called computer control logic) are stored in main memory 608 and/or secondary memory 610. Computer programs may also be received via communications interface 624. Such computer programs, when executed, enable computer system 600 to implement the contemplated embodiments as discussed herein. In particular, the computer programs, when executed, enable processor 604 and main memory 608 to implement the processes, such as the steps in the methods illustrated by flowchart 400 of FIG. 4, discussed above. Accordingly, such computer programs represent controllers of the computer system 600. Where the contemplated embodiments are implemented using software, the soft ate may be stored in a computer program product and loaded into con system 600 using removable storage drive 614, interface 620, hard drive 612 or communications interface 624.

The contemplated embodiments are also directed to computer program products comprising software stored on any computer useable medium. Such software, when executed in one or more data processing device, causes a data processing device(s) to operate as described herein. Embodiments employ any computer useable or readable medium. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage device, etc.), communication mediums (e.g., wired and wireless communications networks, local area networks, wide area networks, intranets, etc.).

While various embodiments have been described above, it should be understood that they have been presented by way of example only, and not limitation. It will be understood by those skilled in the relevant art(s) that various changes in form and details may be made therein without departing from the spirit and scope as defined in the appended claims. It should be understood that the contemplated embodiments are not limited to the examples. The contemplated embodiments are applicable to any elements operating as described herein. Accordingly, the breadth and scope of the disclosure should not be limited by any of the above-described exemplary embodiments, but should be defined only in accordance with the following claims and their equivalents.

What is claimed is:

1. A logic die, comprising:
a processing device configurable to manage virtual memory and operate in an operating mode, wherein the operating mode is selected from a set of operating modes including a slave operating mode and a host operating mode;
command decode circuitry configured to:
pass a command from an external host processor to the processing device when the processing device is operated in the slave operating mode; and
receive the command and determine a command type of the command, wherein the command decode circuitry determines that the command is of a first command type on a condition that the command indicates a sequencing operation, and determines that the command is of a second command type on a condition that the command does not indicate the sequencing operation; and
determine a processing destination for the command based on the command type, wherein the processing destination is either the logic die or a memory die in communication with the logic die.

2. The logic die of claim 1, wherein:
the logic die is communicatively coupled to an interposer die, which is communicatively coupled to the memory die;
the memory die, the interposer die, and the logic die are stacked in a horizontal configuration; and
the memory die and the logic die communicate through the interposer die.

3. The logic die of claim 1, wherein:
the logic die is communicatively coupled to an additional logic die that is configurable to operate in the host operating mode; and
the logic die is configurable to operate in the slave operating mode.

4. The logic die of claim 1, wherein:
the logic die is communicatively coupled to one or more additional memory dies;
the logic die is communicatively coupled to one or more additional logic dies that are communicatively coupled to the one or more additional memory dies;
the processing device is configurable to operate in the host operating mode; and
the one or more additional logic dies are configurable to operate in the slave operating mode.

5. The logic die of claim 1, wherein the processing device is further configured to run autonomously and execute an operating system when operated in the host operating mode.

6. The logic die of claim 1, wherein the processing device is further configured to fetch and execute an instruction stream when operated in the host operating mode.

7. The logic die of claim 1, wherein:
the command decode circuitry is further configured to bypass the processing device; and
the memory die is configured to process the one or more commands based on the first command type.

8. The logic die of claim 1, wherein the processing device is configured to process the one or more commands based on the second command type, the second command type being different from the first command type and indicating a requirement to perform one or more sequencing operations.

9. The logic die of claim 1, wherein:
the external host processor is configured to execute an operating system in an asymmetric configuration with the processing device; and
the processing device is further configured to execute a spawned process from the external host processor.

10. The logic die of claim 1, wherein the processing device is further configurable to operate in a hybrid operating mode, the hybrid operating mode comprising a combination of the slave operating mode and the host operating mode.

11. The logic die of claim 10, wherein the processing device is further configured to run autonomously and accept commands from the external host processor when operated in the hybrid operating mode.

12. A logic die comprising a processing device configurable to manage virtual memory and operate in an operating mode, wherein the operating mode is selected from a set of operating modes including a slave operating mode and a host operating mode;
command decode circuitry configured to:
pass a command to the processing device when the processing device is operated in the slave operating mode; and
receive the command and determine a command type of the command, wherein the command decode circuitry determines that the command is of a first command type on a condition that the command indicates an identifier that specifies a software routine or a pointer to a user-defined software routine, and that the command is of a second command type on a condition that the command does not indicate the identifier or the pointer; and
determine a processing destination for the command based on the command type, wherein the processing destination is either the logic die or a memory die in communication with the logic die.

13. The logic die of claim 12, wherein:
the logic die is communicatively coupled to an interposer die, which is communicatively coupled to the memory die;
the memory die and the logic die are stacked in a horizontal configuration; and
the memory die and the logic die communicate through the interposer die.

14. The logic die of claim 12, wherein:
the logic die is communicatively coupled to an additional logic die that is configurable to operate in the host operating mode; and
the logic die is configurable to operate in the slave operating mode.

15. The logic die of claim 12, wherein:
the logic die is communicatively coupled to one or more additional memory dies;
the logic die is communicatively coupled to one or more additional logic dies that are communicatively coupled to the one or more additional memory dies;
the processing device is configurable to operate in the host operating mode; and
the one or more additional logic dies are configurable to operate in the slave operating mode.

16. The logic die of claim 12, wherein the processing device is further configured to run autonomously and execute an operating system when operated in the host operating mode.

17. The logic die of claim 12, wherein the processing device is further configured to fetch and execute an instruction stream when operated in the host operating mode.

18. The logic die of claim 12, wherein:
- the command decode circuitry is further configured to bypass the processing device; and
- the memory die is configured to process the one or more commands based on the first command type.

19. The logic die of claim 12, wherein the processing device is configured to process the one or more commands based on the second command type, the second command type being different from the first command type and indicating a requirement to perform one or more sequencing operations.

20. The logic die of claim 12, wherein the processing device is further configurable to operate in a hybrid operating mode, the hybrid operating mode comprising a combination of the slave operating mode and the host operating mode.

* * * * *